United States Patent [19]
Zhu

[11] Patent Number: 5,930,164
[45] Date of Patent: Jul. 27, 1999

[54] MAGNETIC MEMORY UNIT HAVING FOUR STATES AND OPERATING METHOD THEREOF

[75] Inventor: Theodore Zhu, Chandler, Ariz.

[73] Assignee: Motorola, Inc., Schaumburg, Ill.

[21] Appl. No.: 09/031,195

[22] Filed: Feb. 26, 1998

[51] Int. Cl.$^6$ .................................................. G11C 11/00
[52] U.S. Cl. ............................................................ 365/158
[58] Field of Search ................................... 365/158, 157, 365/171, 173; 257/421, 30, 317, 422, 427

[56] References Cited

U.S. PATENT DOCUMENTS

| | | | |
|---|---|---|---|
| 5,604,357 | 2/1997 | Hori | 257/24 |
| 5,640,343 | 6/1997 | Gallagher | 365/171 |
| 5,650,958 | 7/1997 | Gallagher | 365/173 |
| 5,764,567 | 6/1998 | Parkin | 365/173 |
| 5,801,984 | 9/1998 | Parkin | 365/158 |

*Primary Examiner*—David Nelms
*Assistant Examiner*—Anh Phung
*Attorney, Agent, or Firm*—William E. Koch; Eugene A. Parsons

[57] ABSTRACT

A new structure of a magnetoresistive random access memory (MRAM) is presented for a high density and fast access operations. The MRAM includes two magnetic memory cells separated by an electrically conductive layer, each cell having two magnetic layers separated by a barrier layer forming a tunneling junction. Each memory cell contains one bit information as directions of magnetic vectors which are switched by an external magnetic field and sensed by a sense current flowing in the MRAM unit. The current creates a drop voltage over the MRAM unit, which indicates four different values according to the states stored in MRAM unit.

21 Claims, 4 Drawing Sheets

MAGNETIC MEMORY UNIT HAVING FOUR STATES AND OPERATING METHOD THEREOF

FIELD OF THE INVENTION

The present invention relates to a magnetic random access memory (MRAM) unit and an operating method thereof, and more particularly, to the MRAM unit formed by two magnetic memory cells, each cell having a tunneling junction.

BACKGROUND OF THE INVENTION

A magnetic memory cell includes a non-magnetic layer sandwiched by magnetic layers in which information is stored as directions of magnetic vectors. This type of the memory cell employs the giant magnetoresistive (GMR) effect which allows magnetic vectors to quickly switch the directions in the magnetic layer by an application of an external magnetic field. When magnetic vectors in both magnetic layers have the same direction, which is called a "Parallel", the magnetic resistance indicates a minimum value over the memory cell while the memory cell shows the maximum value in an opposite direction, which is called an "Antiparallel." Since the external magnetic field alters the direction of magnetic vectors and the magnetoresistive value according to the direction, the GMR effect is applied to a sensor as well as a memory.

The memory cell, for example, has pinned and free magnetic layers separated by an insulation or barrier layer. The magnetic vectors in the pinned magnetic layer are pinned by an anti-ferromagnetic layer placed adjacent the pinned magnetic layer and ones in the free magnetic layer are switched by an external magnetic field. A very thin insulation layer forms a tunneling junction between the pinned and free magnetic layers. In order to sense states in the memory cell, a constant current is applied through the memory cell. As the magnetic resistance varies according to the state stored in the cell, the voltage is sensed over the memory cell. To write or change the state in the memory cell, the external magnetic field is applied that is sufficient to completely switch the direction of the magnetic vectors of the free magnetic layer.

The memory cell memorizes one bit information. As a computer system processes much more information to handle complexes tasks, a memory device with much higher speed and density is needed to improve the performance of the computer system.

Accordingly, it is a purpose of the present invention to provide an improved MRAM device having a high density memory capacity.

It is another purpose of the present invention to provide an improved MRAM device having a high speed operation.

It is still another purpose of the present invention to provide an improved MRAM device having a low power consumption.

SUMMARY OF THE INVENTION

These needs and others are substantially met through provision of a MRAM device which arranges a plurality of MRAM units in a matrix. The MRAM unit has two memory cells separated by an electrically conductive layer, each memory cell includes pinned and free magnetic layers separated by a barrier layer which forms a tunneling junction between the magnetic layers. Two barrier layers in the memory cells have different thicknesses which produce a different magnetic resistance over the MRAM unit according to states stored in the memory cells.

Four different magnetic fields are employed to store four states (00, 11, 01, and 10) in the MRAM. First (00) and second (11) states are stored by applying a first magnetic field and a second magnetic field having an opposite direction to the first magnetic field, respectively. Applying the first magnetic field and then a third magnetic field having an opposite direction to the first magnetic field gives a third state (01) in the MRAM unit. Application of the second magnetic field and a fourth magnetic field having an opposite direction to the second magnetic field allows the MRAM unit to contain a fourth state (10).

DETAILED DESCRIPTION OF THE PREFERRED EMBODIMENTS

Figure 1:
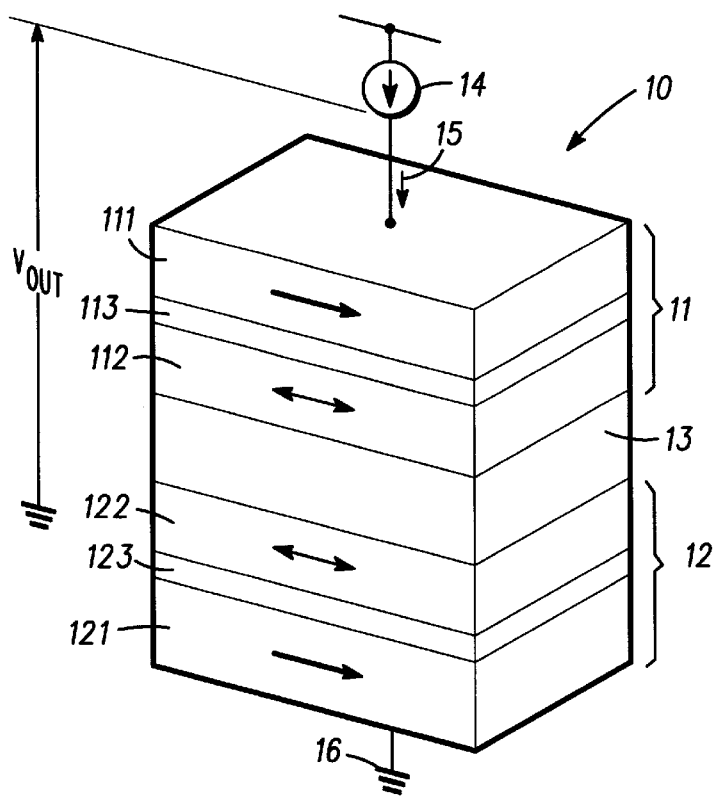
FIG. 1 shows a simplified and enlarged structure of an MRAM unit forming two memory cells.

FIG. 1 shows a simplified and enlarged structure of an MRAM unit 10 which is a basic element for storing four states employed in an MRAM device. The MRAM unit 10 forms first and second memory cells 11 and 12 on a substrate such as a silicon and a glass, which are coupled in series and separated by an electrically conductive layer 13. Conductive layer 13, for example, is made of copper and has at least 0.5 micron thick enough to allows memory cells 11 and 12 to magnetically decouple.

First memory cell 11 includes a first pinned magnetic layer 111 and a first free magnetic layer 112. First pinned layer 111 and free magnetic layer 112 utilize magnetic materials such as CoFe and NiFeCo, respectively. Both layers 111 and 112 have typically 50 Angstrom thick. Magnetic vectors in first pinned layer 111 are magnetically pinned by either an anti-ferromagnetic layer or an anti-ferromagnetic exchange layer (not shown) which is placed adjacent layer 111. Pinned and free layers 111 and 112 sandwiches a barrier layer 113 which forms a tunneling junction therebetween. Barrier layer 113 is made of $Al_2O_3$ and has a thickness of 22–30 Angstrom.

Second memory cell 12 has a second pinned magnetic layer 121 and a second free magnetic layer 122 separated by a second barrier layer 123. Typically, second pinned and free layers 121 and 122 have 50 Angstrom and 30 Angstrom in thickness, respectively. Second free magnetic layer 122 is thinner than first free magnetic layer 112 that gives different hysteresis characteristics between first and second memory cells 11 and 12. Second barrier layer 113 has a thickness of 15–22 Angstrom. As shown later, the difference in resistance of memory cells 11 and 12 indicates a different value which is caused by the different thickness or different barrier height of first and second barrier layers 113 and 123. In other words, a tunneling current in the barrier layer depends on the barrier thickness and the barrier height. Further, the different thicknesses of first and second free layers allow magnetic vectors in first and second magnetic layers to switch at the different magnetic field.

A current source 14 is coupled to MRAM unit 10 to provide a sense current 15 through first and second memory cells 11 and 12 to a common or ground terminal 16. A magnetic resistance over MRAM unit 10 varies according to the states stored in MRAM unit 10, thereby a voltage output $V_{OUT}$ over MRAM unit 10 indicates different values. Voltage output $V_{OUT}$ is compared to threshold voltages which are predetermined from hysteresis characteristics of MRAM unit 10 shown in FIG. 2, and then states stored in MRAM unit 10 are evaluated to provide to an output.

Figure 2:
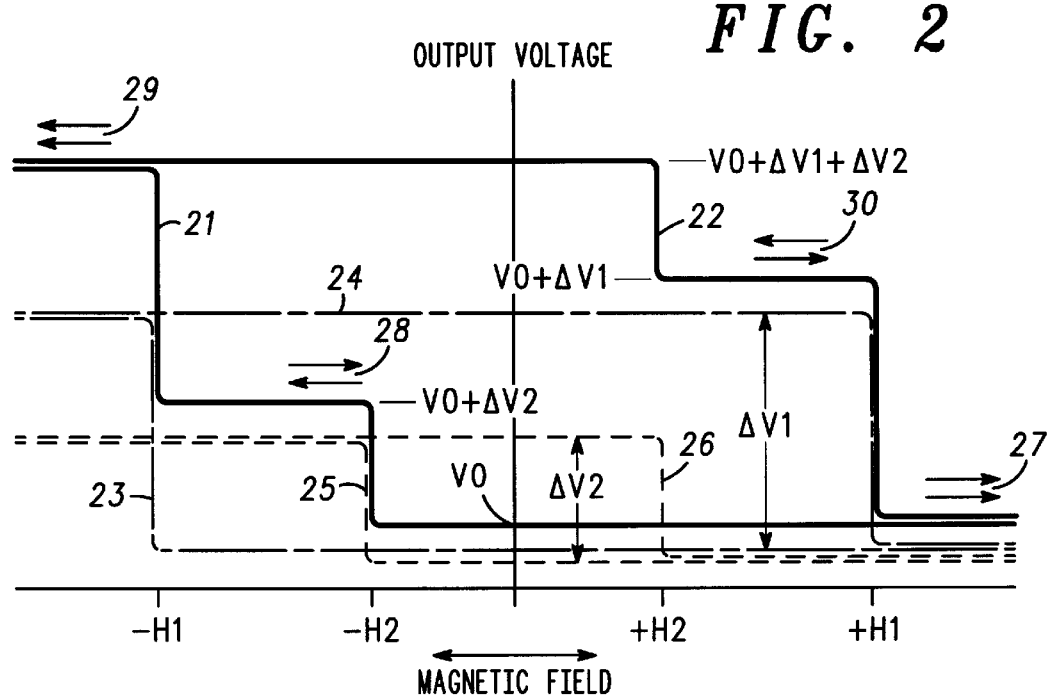
FIG. 2 shows a graph illustrating hysteresis characteristics of the MRAM unit shown in FIG. 1.

Referring to FIG. 2, hysteresis characteristics of MRAM unit 10 are illustrated, which are simplified for better understanding of MRAM characteristics. The abscissa indicates a direction and a strength of a magnetic field applied to MRAM unit 10. The ordinate represents the voltage output $V_{OUT}$ over MRAM unit 10. Pairs of bold arrows 27–30 in FIG. 2 describe directions of magnetic vectors in first and second free magnetic layers 112 and 122, respectively. In other words, a right direction of an arrow means the Parallel while a left direction of an arrow means the Antiparallel. First and second curves 21 and 22 described by solid lines indicate voltage output $V_{OUT}$ over MRAM unit 10 which is achieved for the application of various strengths of magnetic fields in first (right on FIG. 2) and second (left on FIG. 2) directions, respectively. Third and fourth curves 23 and 24 indicated by center lines show a voltage output over first memory cell 11 and fifth and sixth curves 25 and 26 indicated by dashed lines represent a voltage output over second memory cell 12. Superimposing curve 23 on curve 25 and curve 24 on curve 26 produces curve 21 and curve 22, respectively, because first and second memory cells are coupled in series.

Before discussing the hysteresis characteristics of curves 21 and 22, characteristics of first memory cell 11 itself, which are shown in curves 23 and 24, are analyzed. Assuming cell 11 is in the state in which magnetic vectors in layers 111 and 112 point in the Parallel under no magnetic field that is a first direction, the magnetic field decreases down to a value –H1 moving to the left along the abscissa. As shown by curve 23, magnetic vectors in first free magnetic layer 111 are switched to the second direction at the value –H1 and magnetic vectors in layers 111 and 112 are oriented in the Antiparallel. Consequently, a magnetic resistance over first memory cell 11 increases and the voltage output over cell 11 rapidly rises by a first voltage change $\Delta V1$. The voltage change $\Delta V1$ depends on the thickness of first barrier layer 113.

Next increasing the magnetic field from –H1, magnetic vectors in first free layer 112 are switched at magnetic field +H1 to the first direction. Consequently the magnetic resistance is lowered and the voltage output is decreased by $\Delta V1$ because magnetic vectors in layers 111 and 112 point in the Parallel.

Second magnetic cell 12 shows basically the same hysteresis characteristics as first magnetic cell 11 except for threshold magnetic fields ±H2 at which magnetic vectors in free magnetic layer 122 are switched and a voltage change $\Delta V2$ at ±H2. Curves 25 and 26 indicate hysteresis characteristics when the magnetic field changes from +H1 to –H1 and from –H1 to +H1, respectively. At magnetic fields ±H2, the output voltage over cell 12 sharply changes by $\Delta V2$.

Assuming first and second memory cells 11 and 12 have magnetic vectors pointing in the Parallel as shown by arrows 27 in FIG. 2, the magnetic field changes from +H1 to –H1 moving to the left along the abscissa. The voltage output $V_{OUT}$ over MRAM unit 10 traces curve 21. While magnetic vectors in both layers 111 and 121 point in arrows 27, the magnetic resistance of MRAM unit 10 keeps the lowest value which is appeared as voltage output V0. When the magnetic field reaches at –H2, magnetic vectors in only layer 122 switch to the second or left direction which leads cell 12 to point in the Antiparallel. Layers 112 and 122 have magnetic vectors which point in directions indicated by arrows 28. That is, cells 11 and 12 are in the state of the Parallel and the Antiparallel, respectively. The Antiparallel in cell 12 allows the magnetic resistance to increase and produces voltage $\Delta V2$ which raises output voltage $V_{OUT}$ to V0+$\Delta V2$. Further increasing the magnetic field to –H1, magnetic vectors in layer 112 switch to the second direction, that lays both cells 11 and 12 in the Antiparallel as indicated by arrows 29. The antiparallel in both cells 11 and 12 pull voltage output $V_{OUT}$ up to V0+$\Delta V1$+$\Delta V2$.

Next, changing the magnetic field toward +H1 along curve 22, before the magnetic field reaches at +H2, MRAM unit 10 keeps both cells 11 and 12 in the Antiparallel and holds the same voltage output as V0+$\Delta V1$+$\Delta V2$. Over the magnetic field +H2, magnetic vectors in only layer 122 switch to the first direction as shown by arrows 30 which causes the output voltage to drop by $\Delta V2$ to V0+$\Delta V1$. Further increasing the magnetic field, magnetic vectors in layer 112 switch at +H1 as indicated by arrows 27 by which the magnetic resistance is reduced and voltage output over MRAM unit 10 is decreased by $\Delta V1$ to V0.

As described earlier, MRAM unit 10 gives the hysteresis curve indicating four stable stages which are caused by magnetic directions in free magnetic layers 112 and 122 as shown by arrows 27–30. Accordingly, MRAM unit 10 memorizes four bit information corresponding to the four stable stages.

Figure 3:
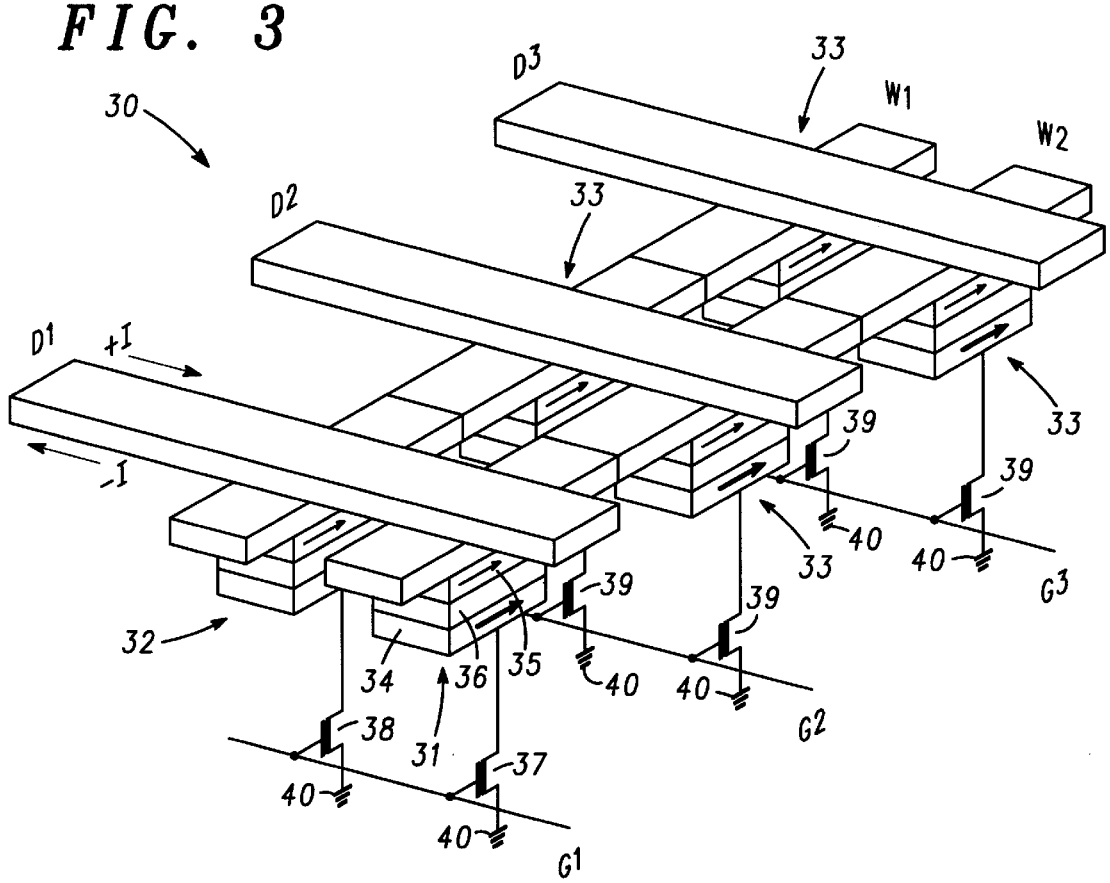
FIG. 3 shows a simplified and enlarged MRAM device.

FIG. 3 illustrates a simplified and enlarged MRAM device 30 having six memory units 31–33. It should be noted that MRAM device 30 contains much more memory cells according to a need of the memory capacity. Each memory cell in FIG. 3 has the same structure as one in FIG. 1. For the sake of simplicity, two memory cells 34 and 35 separated by the conductive layer 36 are described, that is, neither pinned nor free layer is expressed in cells 34 and 35. Arrows indicated within cells 34 and 35 represent directions of magnetic vectors in the free magnetic layer. MRAM units 31–33 are arranged in a matrix. Word lines W1–W2 in rows and digit lines D1–D3 in columns are extended so as to place MRAM units 31–33 on intersections of word lines W1–W2 and digit lines D1–D3. MRAM unit 31, for example, is placed on the intersection of word line W2 and digit line D1. Each word line is electrically connected to MRAM units aligned in a row. Gate lines G1–G3 is extended in columns, each gate line being electrically coupled to MRAM units lined in a column through gate transistors 37–39. Gate line G1, for instance, is connected to MRAM units 31 and 32 through gate transistors 37 and 38, respectively.

In a reading operation for MRAM unit 31, for example, gate line G1 is activated to turn gate transistor 37 on and a constant sense current is provide from a current source (not shown) through word line W2 to MRAM unit 31. A voltage over MRAM unit 31 changes depending on directions of magnetic vectors in memory cells 34 and 35. Accordingly, after activating gate line G1 and word line W2, states stored in MRAM unit 31 is evaluated and introduced from a voltage appeared on word line W2. For example, voltage outputs V0, V0+$\Delta V1$, V0+$\Delta V2$, and V0+$\Delta V1$+$\Delta V2$ are evaluated as logics "00", "01", "10", and "11", respectively.

Figure 4:
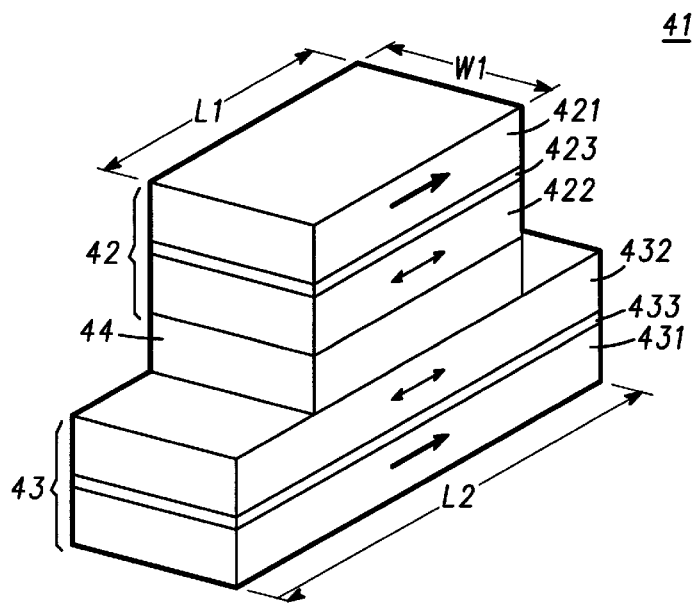
FIG. 4 shows a simplified and enlarged structure of another MRAM unit.

Referring to FIG. 4, a simplified and enlarged structure of another MRAM unit 41 is illustrated. MRAM unit 41 includes a first memory cell 42, a second memory cell 43, and an electrically conductive layer 44 which is sandwiched by cells 42 and 43. First memory cell 42 has a pinned magnetic layer 421 and a free magnetic layer 422 which are separated by a first barrier layer 423 while second magnetic layer 43 has a pinned magnetic layer 431 and a free magnetic layer 432 which are separated by a second barrier layer 433. Both barrier layers 423 and 433 are made of an insulating material such as $Al_2O_3$, by which a tunneling junction is formed between magnetic layers. MRAM unit 41 has the same structure as MRAM unit 10 in FIG. 1 except that first memory cell 42 has a different area from second memory cell 43 and first barrier layer 423 has the same thickness as second barrier layer 433. For example, a width W1 and a length L1 of first memory cell 42 are typically 0.25 $\mu$m and 0.35 $\mu$m, respectively, while a length L2 of second memory cell 43 is 0.5 $\mu$m.

First memory cell 42 and second memory cell 43 indicate different hysteresis curves each other as well as hysteresis curves of memory cells 11 and 12 shown in FIG. 2 because first and second memory cells 42 and 43 have different areas.

Figure 5:
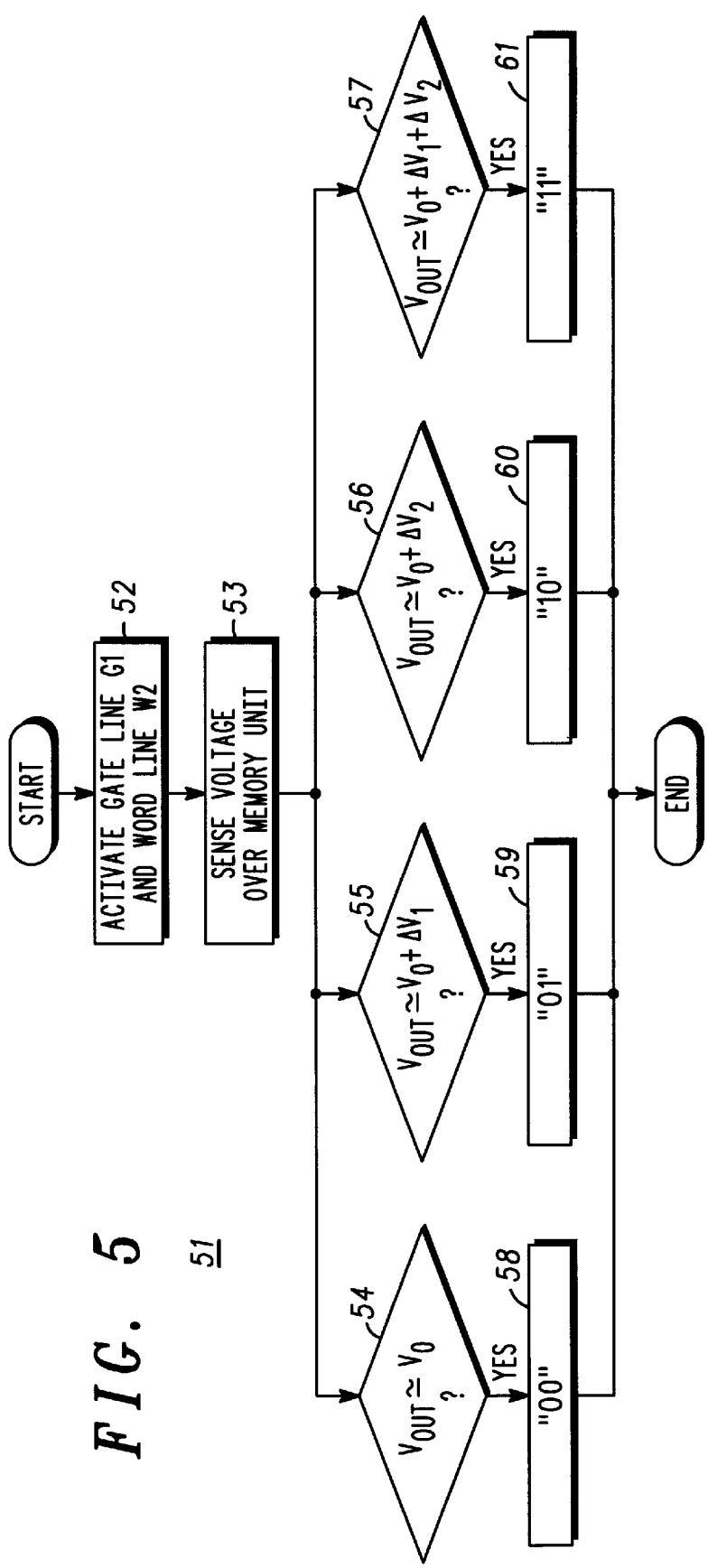
FIG. 5 shows a flowchart illustrating a process in a "write" mode in accordance with the present invention.

Referring to FIG. 5, a flowchart 51 for the reading operation is illustrated. This flowchart shows steps to sense states stored in MRAM unit 31, for instance. In order to get a sequence of information, i.e. a byte and a word, the flow defined in FIG. 5 is repeated.

First of all, at block 52, gate line G1 and word line W2 in FIG. 3 are activated so that gate transistor 37 is turned on, then the sense current flows from word line W2 through MRAM unit 31 and gate transistor 37 to a ground or common terminal 40. Moving to block 53, voltage output $V_{OUT}$ on word line W2 is sensed for the next evaluation step. When voltage output $V_{OUT}$ is approximately equal to V0 (block 54), V0+$\Delta$V1 (block 55), V0+$\Delta$V2 (block 56), and V0+$\Delta$V1+$\Delta$V2 (block 57), it is evaluated that MRAM unit 31 contains a logic "00" (block 58), a logic "01" (block 59), a logic "10" (block 60), and a logic "11" (block 61), respectively.

Figure 6:
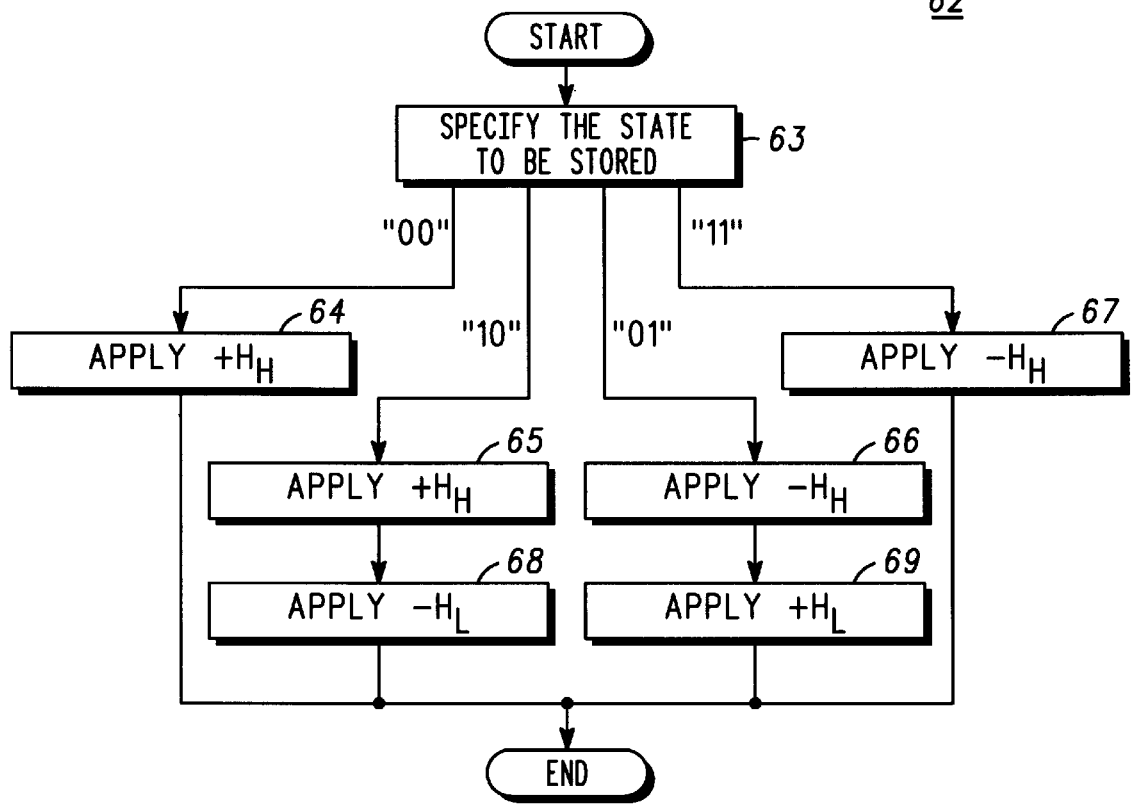
FIG. 6 shows a flowchart illustrating a process in a "read" mode in accordance with the present invention.

The process of writing states is illustrated in the flowchart of FIG. 6. As well as the reading operation, the flowchart describes a set of steps for storing states into MRAM unit 31, however repeating of the steps is executed for writing a sequence of information. Under the writing operation, an MRAM unit on the intersection of word and digit lines activated is specified for storing states. A combination of magnetic fields generated by two currents provided into word and digit lines is applied to the MRAM unit, specifically magnetic free layers 112 and 122. A direction of combined magnetic field is specified by directions of a digit current in the digit line. The combined magnetic field allows directions in free magnetic layers to be switched. A current source (not shown) for the digit current controls an amount and directions of the digit current.

At a block 63, a state to be stored in MRAM unit 31 is specified. The process goes to a block 64 for "00", a block 65 for "01", a block for "10", and a block for "11", respectively. When a logic "00" is stored, a magnetic field +$H_H$, which is more than +H1, is applied to form both memory cells 11 and 12 in the Parallel (block 64), by which the logic "00" is stored in MRAM unit 31. In order to store a logic "10", two steps are carried out. First of all, magnetic field +$H_H$ is applied to store the logic "00" (block 65), and then a magnetic field -$H_L$, which is between -H2 and -H1, is applied to switch the direction of magnetic vectors in only layer 122 (block 68). Application of magnetic fields -$H_H$ and then +$H_L$ forms memory cell 112 in the Antiparallel and cell 122 in the Parallel that allows MRAM unit 31 to store the logic "01" (blocks 66 and 69). When the logic "11" is stored, magnetic field -$H_H$ is applied so that both memory cells 34 and 35 are set to the Antiparallel (block 67).

Thus, a MRAM unit and a MRAM device having MRAM units are disclosed. The MRAM unit is formed with two memory cells which are separated by an electrically conductive layer. The MRAM unit memorizes a four-state information which is written and read at the same time. Accordingly, a high density device and a high speed writing and reading operations are attained. Further, the memory cell has magnetic layers separated by an insulation or barrier layer which forms a tunneling junction between the layers. This thin barrier layer allows a tunnel current to flow therein, that helps a total amount of current in the MRAM device to reduce.

What is claimed is:

1. A magnetoresistive random access memory (MRAM) unit comprising:

a first magnetic memory cell including magnetic layers separated by a first barrier layer forming a tunneling junction;

a second magnetic memory cell including magnetic layers separated by a second barrier layer forming a tunneling junction, the second magnetic memory cell having a different resistance from one of the first barrier layer; and an electrically conductive layer sandwiched between the first and second magnetic memory cells.

2. The MRAM unit as claimed in claim 1 wherein the magnetic layers in the first magnetic cell include first pinned and free layers, and the magnetic layers in the second magnetic cell include second pinned and free layers, magnetic vectors in the first and second pinned magnetic layers not being switched by an external magnetic field and magnetic vectors in the first and second free magnetic layers being switched by the external magnetic field.

3. The MRAM unit as claimed in claim 2 further including magnetic layers anti-ferromagnetically coupled with the first and second pinned magnetic layers, respectively.

4. The MRAM unit as claimed in claim 1 wherein the first barrier layer has a different thickness from the second barrier layer.

5. The MRAM unit as claimed in claim 4 wherein the second barrier layer is twice as thick as the first barrier layer.

6. The MRAM unit as claimed in claim 1 wherein the first magnetic memory cell has a different area from the second magnetic memory cell.

7. The MRAM unit as claimed in claim 1 further including a first conductive line electrically coupled to the first magnetic cell for providing a sense current.

8. The MRAM unit as claimed in claim 7 further including further including a switch coupled to the MRAM unit for controlling the sense current.

9. The MRAM unit as claimed in claim 8 further including a second conductive line placed adjacent the MRAM unit for applying an external magnetic field to the MRAM unit.

10. The MRAM unit as claimed in claim 1 wherein the first barrier layer has a different barrier height from the second barrier layer.

11. A magnetoresistive random access memory (MRAM) device comprising:

a substrate on which the MRAM device is formed;

a plurality of MRAM units arranged in rows and columns, each MRAM unit comprising:

a first magnetic memory cell including magnetic layers separated by a first barrier layer forming a tunneling junction, a second magnetic memory cell including magnetic layers separated by a second barrier layer forming a tunneling junction, the second magnetic memory cell having a different resistance from one of the first barrier layer, and an electrically conductive layer sandwiched between the first and second magnetic memory cells;

a plurality of first conductive lines for providing a sense current, one first conductive line for each row, each first conductive line being electrically coupled to each of the first magnetic memory cell of each MRAM unit in the row; and a plurality of switches electrically coupled to each of the second magnetic memory cell of each MRAM unit.

12. The MRAM device as claimed in claim 11 wherein the magnetic layers in the first magnetic cell include first pinned and first free magnetic layers, and the magnetic layers in the second magnetic cell include second pinned and second free magnetic layers, magnetic vectors in the first and second pinned magnetic layers not being switched by an external magnetic field and magnetic vectors in the first and second free magnetic layers being switched by the external magnetic field.

13. The MRAM unit as claimed in claim 11 wherein the first barrier layer has a different thickness from the second barrier layer.

14. The MRAM unit as claimed in claim 11 wherein the first magnetic memory cell has an different area from the second magnetic memory cell.

15. The MRAM device as claimed in claim 11 further including a plurality of second conductive lines being placed adjacent each of the MRAM units in the column, for applying an external magnetic field generated by a current therein to the MRAM unit.

16. The MRAM device as claimed in claim 11 further including a current source being coupled to the first conductive lines.

17. The MRAM unit as claimed in claim 11 wherein the first barrier layer has a different barrier height from the second barrier layer.

18. A method for writing first, second, third, and fourth states in a magnetoresistive random access memory (MRAM) unit including a conductive layer sandwiched between two magnetic tunnel junction cells, each magnetic tunnel junction cell storing one bit information, the method comprising the steps of:

applying a first magnetic field having a first strength in a first direction to the MRAM unit when the first state (00) is stored in the MRAM unit;

applying a second magnetic field having a second strength in a second direction opposite to the first direction to the MRAM unit when the second state (11) is stored in the MRAM unit;

applying the first magnetic field and then applying a third magnetic field having a third strength lower than the second strength in the second direction, to the MRAM unit, when the third state (01) is stored in the MRAM unit; and applying the second magnetic field and then applying a fourth magnetic field having a fourth strength lower than the first strength in the first direction, to the MRAM unit, when the fourth state (10) is stored in the MRAM unit.

19. The method as claimed in claim 17 wherein the step of applying the second magnetic field is a step of applying a magnetic field having a strength equivalent to the first strength in the second direction, and the step of applying the fourth magnetic field is a step of applying a magnetic field having a strength equivalent to the third strength in the first direction.

20. A method for sensing first, second, third, and fourth states in a magnetoresistive random access memory (MRAM) unit including a conductive layer sandwiched between two magnetic tunnel junction cells, each magnetic tunnel junction cell storing one bit information, the method comprising the steps of:

providing a sense current to the MRAM unit;

sensing a drop voltage over the MRAM unit; and determining the state stored in the MRAM unit from the drop voltage in accordance with predetermined criteria.

21. The method as claimed in claim 20 wherein the step of determining the state stored in the MRAM unit from the drop voltage in accordance with predetermined criteria includes a step of determining the state stored in the MRAM unit as the first state when the drop voltage falls within a first voltage range, the second state when the drop voltage falls within a second voltage range, the third state when the drop voltage falls within a third voltage range, and the fourth state when the drop voltage falls within a fourth voltage range.

* * * * *

UNITED STATES PATENT AND TRADEMARK OFFICE
CERTIFICATE OF CORRECTION

PATENT NO.   : 5,930,164
DATED        : November 3, 1998
INVENTOR(S)  : Chen et al.

It is certified that error appears in the above-identified patent and that said Letters Patent is hereby corrected as shown below:

<u>Column 1,</u>
Line 4, after the Title, please add as a new first paragraph the following paragraph:
   -- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*